(12) United States Patent
Kamgaing et al.

(10) Patent No.: US 10,477,596 B2
(45) Date of Patent: Nov. 12, 2019

(54) BLADE COMPUTING SYSTEM WITH WIRELESS COMMUNICATION BETWEEN BLADES WITHIN A BLADE ENCLOSURE

(71) Applicant: Intel Corporation, Santa Clara, CA (US)

(72) Inventors: Telesphor Kamgaing, Chandler, AZ (US); Rahul Khanna, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/748,580

(22) PCT Filed: Nov. 23, 2015

(86) PCT No.: PCT/US2015/062205
§ 371 (c)(1),
(2) Date: Jan. 29, 2018

(87) PCT Pub. No.: WO2017/052673
PCT Pub. Date: Mar. 30, 2017

(65) Prior Publication Data
US 2018/0227963 A1     Aug. 9, 2018

Related U.S. Application Data

(63) Continuation-in-part of application No. PCT/US2015/052463, filed on Sep. 25, 2015.

(51) Int. Cl.
*H04W 76/10*     (2018.01)
*H01L 23/66*     (2006.01)
(Continued)

(52) U.S. Cl.
CPC ............. *H04W 76/10* (2018.02); *H01L 23/66* (2013.01); *H01L 24/17* (2013.01);
(Continued)

(58) Field of Classification Search
None
See application file for complete search history.

(56) References Cited

U.S. PATENT DOCUMENTS

| 9,450,635 B2 * | 9/2016 | Adiletta | H04B 1/40 |
| 2004/0199568 A1 * | 10/2004 | Lund | H04L 69/40 |
| | | | 709/201 |

(Continued)

FOREIGN PATENT DOCUMENTS

| KR | 10-2004-0027930 | 4/2004 |
| KR | 101412946 | 6/2014 |

(Continued)

OTHER PUBLICATIONS

International Search Report and Written Opinion for International Patent Application No. PCT/US2015/062205 dated Jun. 23, 2016, 16 pgs.

(Continued)

*Primary Examiner* — Lonnie V Sweet
(74) *Attorney, Agent, or Firm* — Schwabe, Williamson & Wyatt P.C.

(57) ABSTRACT

A blade computing system is described with a wireless communication between blades. In one embodiment, the system includes a first blade in the enclosure having a radio transceiver to communicate with a radio transceiver of a second blade in the enclosure. The second blade has a radio transceiver to communicate with the radio transceiver of the first blade. A switch in the enclosure communicates with the first blade and the second blade and establishes a connection through the respective radio transceivers between the first blade and the second blade.

13 Claims, 8 Drawing Sheets

(51) Int. Cl.
    *H01L 23/00*     (2006.01)
    *H01L 25/065*     (2006.01)
    *H01L 25/16*     (2006.01)
    *H01Q 1/22*     (2006.01)
    *H04B 1/48*     (2006.01)
    *H04Q 1/02*     (2006.01)
    *H05K 7/14*     (2006.01)
    *H01Q 3/30*     (2006.01)
    *H04B 1/38*     (2015.01)

(52) U.S. Cl.
CPC ...... *H01L 25/0655* (2013.01); *H01L 25/0657* (2013.01); *H01L 25/16* (2013.01); *H01Q 1/2266* (2013.01); *H01Q 1/2283* (2013.01); *H04B 1/48* (2013.01); *H04Q 1/15* (2013.01); *H05K 7/1487* (2013.01); *H01L 24/16* (2013.01); *H01L 24/73* (2013.01); *H01L 2223/6616* (2013.01); *H01L 2223/6677* (2013.01); *H01L 2223/6683* (2013.01); *H01L 2223/6688* (2013.01); *H01L 2224/16221* (2013.01); *H01L 2224/16235* (2013.01); *H01L 2224/73253* (2013.01); *H01L 2225/0652* (2013.01); *H01L 2225/06517* (2013.01); *H01L 2225/06548* (2013.01); *H01L 2225/06572* (2013.01); *H01L 2225/06589* (2013.01); *H01L 2924/1033* (2013.01); *H01L 2924/10253* (2013.01); *H01L 2924/10329* (2013.01); *H01L 2924/1421* (2013.01); *H01L 2924/1432* (2013.01); *H01L 2924/1434* (2013.01); *H01L 2924/15153* (2013.01); *H01L 2924/15192* (2013.01); *H01L 2924/15311* (2013.01); *H01L 2924/15313* (2013.01); *H01L 2924/15321* (2013.01); *H01L 2924/19105* (2013.01); *H01Q 3/30* (2013.01); *H04B 1/38* (2013.01)

(56) References Cited

U.S. PATENT DOCUMENTS

| | | | |
|---|---|---|---|
| 2007/0027948 A1* | 2/2007 | Engebretsen | G06F 1/181 709/203 |
| 2009/0016417 A1 | 1/2009 | Rofougaran | |
| 2009/0150547 A1 | 6/2009 | Tripathi | |
| 2011/0087799 A1* | 4/2011 | Padhye | H04L 12/6418 709/235 |
| 2001/0268441 | 11/2011 | Goldstein et al. | |
| 2014/0176368 A1 | 6/2014 | Kamgaing et al. | |
| 2014/0233460 A1* | 8/2014 | Pettus | H04Q 1/15 370/328 |

FOREIGN PATENT DOCUMENTS

| WO | WO-2008156765 | 12/2008 |
|---|---|---|
| WO | WO-2012040376 | 3/2012 |

OTHER PUBLICATIONS

International Search Report and Written Opinion for International Patent Application No. PCT/US2015/052463 dated Jul. 11, 2016, 15 pgs.

International Preliminary Report on Patentability for PCT/US2015/062205 dated Apr. 5, 2018, 12 pages.

* cited by examiner

BLADE COMPUTING SYSTEM WITH WIRELESS COMMUNICATION BETWEEN BLADES WITHIN A BLADE ENCLOSURE

CROSS-REFERENCE TO RELATED APPLICATIONS

This patent application is a U.S. National Phase Application under 35 U.S.C. § 371 of International Application No. PCT/US2015/062205, filed Nov. 23, 2015, entitled "BLADE COMPUTING SYSTEM WITH WIRELESS COMMUNICATION BETWEEN BLADES WITHIN A BLADE ENCLOSURE," which is a continuation-in-part of prior International Application Serial No. PCT/US15/52463, filed 25 Sep. 2015, entitled Microelectronic Package with Wireless Interconnect by Telesphor Kamgaing et al., the contents of which are hereby incorporated by reference fully herein and the priority of which is hereby claimed.

FIELD

The present description relates to communication between blades of a computing enclosure and in particular to wireless communication within the enclosure.

BACKGROUND

Many types of computing, communication, and routing functions are provided using a blade enclosure filled with blades. The blades may provide switching, routing, storage, storage array network access and computing functions. A computing blade includes a processor, non-volatile program storage, data interfaces and some amount of local memory for software or for data storage. A storage blade will likely include the same components but optimized to maximize the storage capacity and speed of access. Other types of blades are optimized in other ways. For computing and many of the other blade types, most of the computer including its operating system and applications are on the blade while the enclosure provides power, cooling, management, and networking. The enclosure houses multiple blades so that the enclosure provides a common infrastructure to support the entire chassis, rather than providing each of these on a per server box basis. When the blades are individually hot-swappable, the blade enclosure may provide more reliable service than high power individual servers.

Blade servers are employed for many tasks that are not best served by a single autonomous computer, such as web hosting, virtualization, and cluster computing. The blade structure may also be easy to upgrade in speed, computing power, and storage space by adding more blades or swapping in more powerful blades.

A new family of blade server systems is referred to as microservers. Microservers are designed to provide the types of services enjoyed by big data at a much lower cost for small to mid-size businesses. Microserver blades consisting of one or more CPUs, a memory, and an Ethernet data communications interface are mounted side-by-side in a single chassis. Backup and redundancy functions can be built in so that the failure of one blade does not affect the other and the failed blade can easily be swapped out.

The blades communicate with each other and any outside connection through a backplane in the blade enclosure. The blade enclosure also provides power, management and other functions. All of the blades are connected together through the backplane. This single connection is much simpler for maintenance and repair than direct communication between the individual units. A similar architecture is used for some communication switching systems, for network storage arrays, and for some medium scale server rack systems. For other systems, while each computer module is on a rack beside or near other computer modules, all communications between the modules are through a network switch. System management is also through the same network switch but requires a separate terminal.

BRIEF DESCRIPTION OF THE DRAWINGS

Embodiments are illustrated by way of example, and not by way of limitation, in the figures of the accompanying drawings in which like reference numerals refer to similar elements.

DETAILED DESCRIPTION

For microserver and similar backplane-based systems, there may be no direct communication between the individual computing or storage units. When all communications go through a shared backplane, the data routing is more complex and has more latency. The larger the number of blades, the greater the routing complexity and the greater the latency.

By reducing the complexity of the backplane and also by reducing the complexity of the CPU (Central Processing Unit) packages microservers and similar systems may be made less expensive. As further described herein, on-demand direct access may be provided to the state of each module or unit. This allows for real time management and monitoring of operating conditions, such as temperature, load assignment, power management, etc., This can lead to additional operational cost saving.

As described herein, a high-speed wireless network may be used inside the chassis of the microserver or any other system with distributed compute nodes. The wireless network provides for point-to-point communication between the individual nodes or modules (or Systems on a Chip (SoCs)). The workload management and power consumption may then also be managed in real time without physically laying out a complex network of separate manageability busses, such as SMBUS (System Management Bus), PECI (Platform Environment Control Interface), etc. through all the compute agents.

The wireless interconnects also allows the backplane that is used in current microserver boards to be simplified or removed. This can lead to substantial cost savings, simpler routing complexity, reduced PCB (Printed Circuit Board) layer count, and simpler data interconnects. With a readily available high speed data interconnect, resources may also be reconfigured without using a switch matrix. As an example, a CPU can use the memory or hard disk on a different board.

Figure 1B:
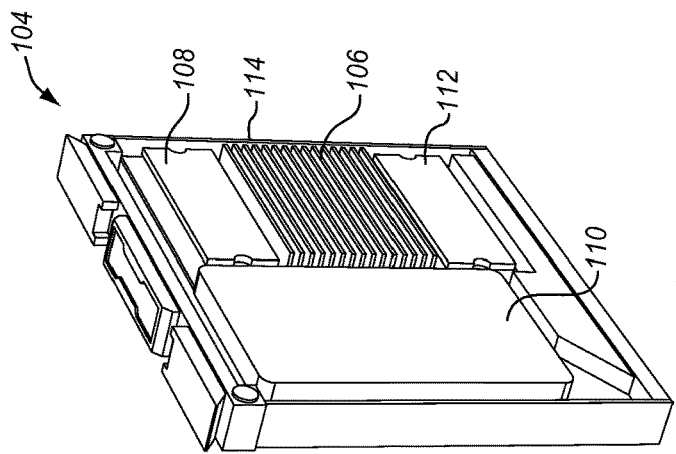
FIG. 1B is an isometric diagram of a blade of the blade-based server system of FIG. 1A according to an embodiment.
Figure 1A:
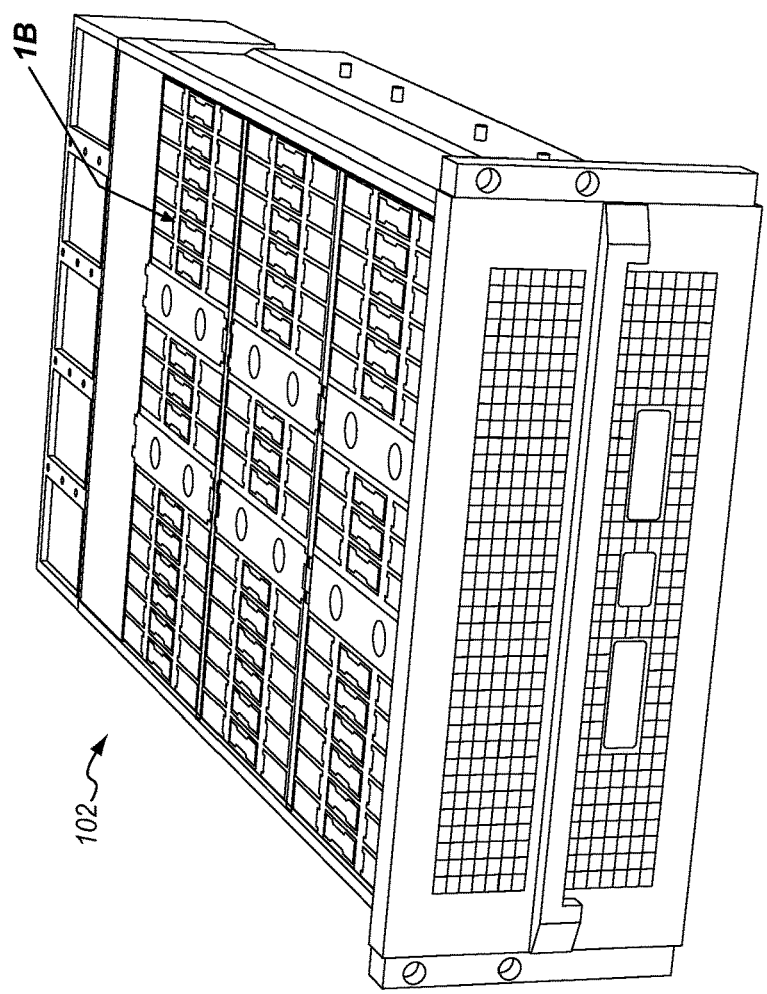
FIG. 1A is an isometric diagram of a blade-based server system according to an embodiment.

FIG. 1A is an isometric diagram of a blade computing system suitable for a microserver or other blade type of device. The server has a main enclosure 102 which contains twelve, sixteen, or more blades or cards 104. The configuration of each blade may be adapted to suit different uses.

As shown in FIG. 1B, a blade 104 has a central processing unit (CPU) or controller 106 on a motherboard 114. The CPU is coupled to high speed memory such as DRAM (Dynamic Random Access Memory 108, and a mass memory 110 such as a hard disk or solid state drive. As described herein, a millimeter wave radio is attached to the CPU package. Additional radios may be attached in other locations on the front or back side of the motherboard. The blade may have more or fewer components and some functions may be integrated into the CPU package.

A backplane interface 112 is mounted to the motherboard. This interface connects to the backplane inside the enclosure 102. The backplane carries power, management and control information, and data connections to other blades and external components. The backplane may have a slow system management bus, such as SMBus, an Ethernet interface for higher speed data connections and one or more PCI (Peripheral Component Interface) lanes for higher speed data connections. The particular interface types and speeds may be selected to suit any particular intended application for the system. The enclosure may also have one or more network switch modules 114 integrated into the enclosure 102 as shown or provided as one or more additional blades.

Figure 2:
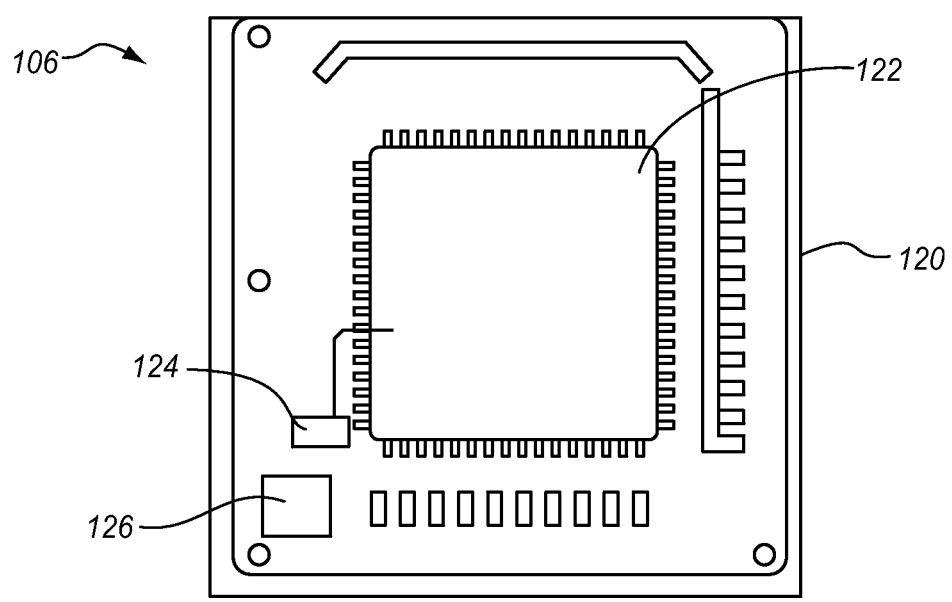
FIG. 2 is a top view diagram of a processor package with a radio and antenna according to an embodiment.

FIG. 2 is a top view diagram of a microserver (CPU) package 106 with a processor 122 attached to a package substrate 120. The package may include a radio in the form of a die 124 on the package substrate connected through traces on the substrate or in any other way to an antenna 126 on the substrate. The radio die and antenna allow for a high speed data connection directly from the CPU package to other components.

The packages are discussed herein as being central processing units and, in particular, as server CPUs. However, the techniques and configurations described herein may be applied to many different types of chips for which a high speed communications link would be suitable. In some implementations, the chip may include many different functions such as with a SoC (System on a Chip). In other implementations, the chips may be memory, a communications interface hub, a storage device, co-processor or any other desired type of chip. In addition, the two chips may be different so that one may be a CPU and the other may be a memory or a chipset, for example.

Each chip is also connected through the package to a respective radio 126. The radio may be formed of a single die or a package with multiple dies or using another technique. Each radio is mounted to the package near the edge of the package that is near to the other chip. The package may include copper traces, lines, or layers to connect particular lands, pads, or solder balls of the chip to the radio die for data and control signals. The radio die may also be connected to the chip to provide power to the radio die. Alternatively, the radio die may obtain power from an external source through the package connection to the PCB.

While different frequencies may be used to suit particular implementations. Millimeter wave and sub-THz frequencies allow for an antenna that is small enough to be integrated on the same package that is normally used for the chip. The antennas may also be constructed using the same materials that are used in the fabrication of the package substrate and still exhibit good electrical performance.

In some embodiments, a broadband wireless interconnect may be used. For example with a radio operating in a radio frequency range of from 100-140 GHz, the size of each antenna including the keep out zone can be as small as 1.25×1.25 mm to 2.5×2.5 mm. The actual antenna may be still smaller. Considering a typical server CPU package, more than 30 antennas of 1.25×1.25 mm may be placed along one edge of the package. This would allow more than 30 separate links each carrying 40-80 Gb/s each over a short distance. The separate links may all be used to communicate with a single second chip or there may be different package antennas placed next to different antennas of the CPU package. This allows the CPU package to communicate with different chips using different links.

Wireless interconnects are used as described herein between the CPUs, between the CPU and a switch, and between the CPUs and other chips. The switch may demodulate and downconvert all the wireless signals and then retransmit them. Alternatively, the switch may use direct passband or passive switching, such as free space reflectors, lenses, and wave guides. Reflectors and other passives may even be attached to the system board or to a case or other housing. With millimeter waves, the propagation is very similar to that of optical propagation with well-defined propagation paths between the nodes. The waves are highly directional but not as sensitive to alignment as is the case with free space optics. In addition millimeter wave carriers are able to provide very high data rates, such as 160 Gbps or more on a single link, with less power consumption than laser diodes.

Two main components may be used for many of the described implementations. Wireless millimeter wave nodes on at least two CPUs or other packages and a wireless switch. The millimeter wave nodes have a millimeter wave radio die and an antenna. The millimeter wave radio die can be part of a CPU package in the same or a different die from the CPU. The radio may also be in a separate package with a connection to the CPU or other die. The nodes can be dedicated to a CPU, memory, nonvolatile storage, chipset or any other desired high speed die or device. The nodes do not have to be on the same motherboard as the switch or as each other. One of the two nodes may be on a different motherboard or on a chassis component. One advantage of the wireless communications and the switch is that there may also be many more than two nodes.

Figure 3:
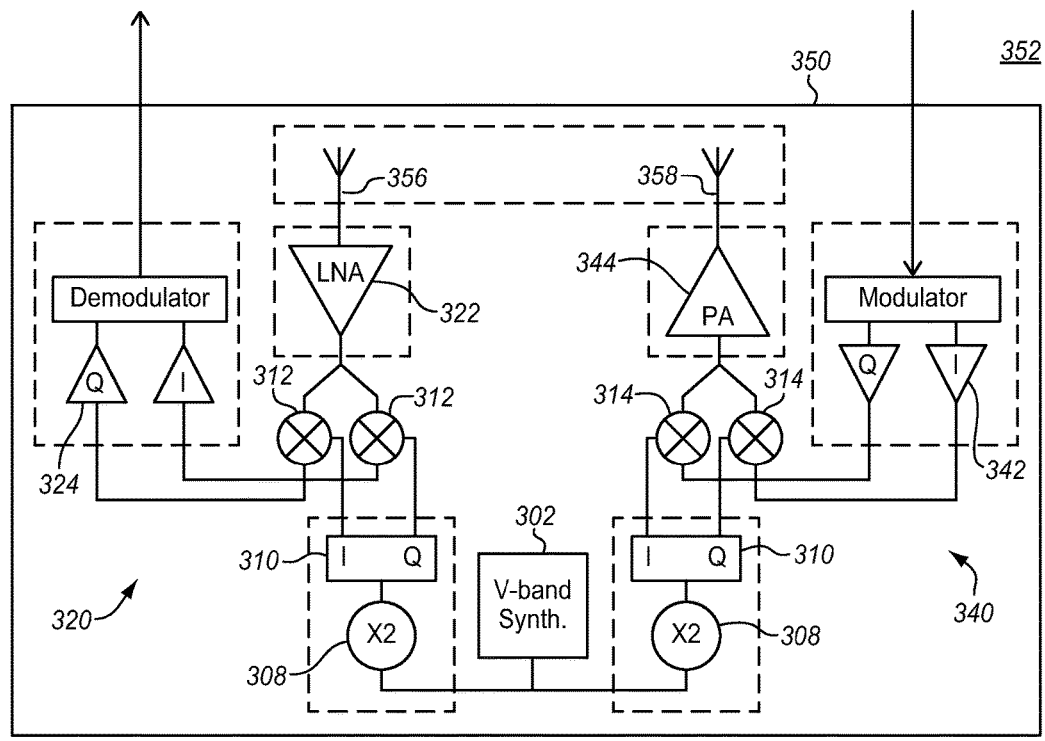
FIG. 3 is a block diagram of a radio chip and related components according to an embodiment.

FIG. 3 is a block diagram of an example of a transceiver or radio chip system architecture and connected components that may be used for the wireless interconnect described herein. The transceiver chip may take a variety of other forms and may include additional functions, depending on the particular implementation. This radio design is provided only as an example. The radio chip 350 is mounted to the package substrate 352 to which the primary integrated circuit die or chip 202, 203 is also mounted as shown in FIG. 1. The substrate 352 is mounted to the PCB or motherboard.

The radio package may include a local oscillator (LO) 302 or a connection to an external LO and optionally a switch that allows the external LO feed to be used instead of or in addition to the internal LO. The LO signal may pass an amplifier and multiplier, such as an active doubler 308 and 0/90° quadrature hybrids 310 to drive an upconverter and mixers 314.

The RX (receive) chain 320 may contain a receive antenna 356 in the package coupled to a low noise amplifier (LNA) 322 and a wideband baseband (BB) amplification chain 324 with downconverters 312 for analog to digital conversion. The TX (transmit) chain 340 may include a BB digital driver chain 342 to the upconverters 314, and a power amplifier (PA) 344 to the transmit antenna 358. There may be multiple transmit and receive chains to transmit and receive over multiple channels simultaneously. The various channels may be combined or consolidated in different ways, depending on the particular implementation.

The TX and RX chains are both coupled through the substrate to the antenna. There may be a single antenna for TX and RX or there may be separate RX and TX antennas as shown. The antennas may be designed to have different radiation patterns to suit different wireless connections. In the example of FIG. 2, the first chip's antenna 216 has a wide beam transmit and receive pattern 330. This may allow the chip to communicate with multiple antennas in different locations on the motherboard. The second chip's antenna 218, on the other hand has a narrow beam transmit and receive pattern 332. This allows power to be concentrated in a single direction for communication with just one other device.

Figure 4:
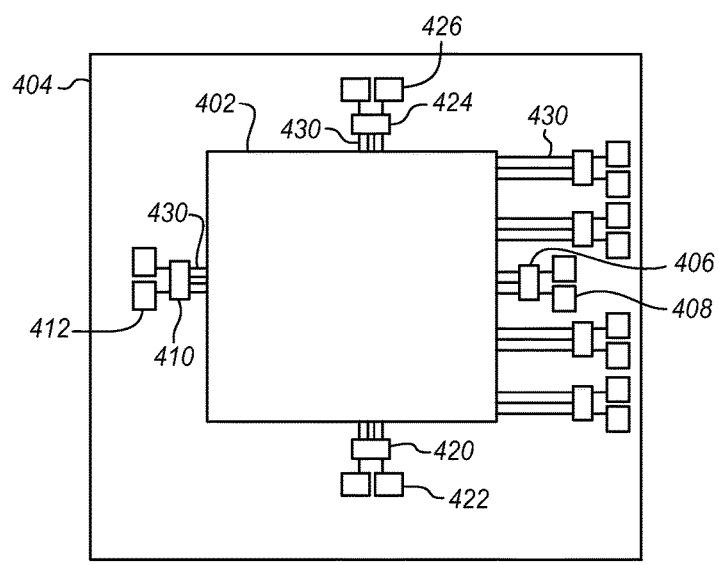
FIG. 4 is a top view diagram of a package with multiple wireless interconnects for chip-to-chip communications according to an embodiment.

FIG. 4 is a top view diagram of an example of an implementation of multiple wireless interconnects on a single microserver package. In this example, separate antennas are used to transmit and receive, but it is also possible to share the antenna between the Tx and the Rx chains. The antenna size may vary from 1.25×1.25 mm or less to 2.5×2.5 mm or more depending on the carrier frequency, desired gain, and transmission range.

A single integrated circuit chip or die 402 includes both processing and baseband systems and is mounted to a package 404. The baseband sections of the chip are coupled through on package traces 430 to radio chips or dies which are in turn coupled through the package to antennas. In this example, the die integrated circuit chip is a CPU for a microserver and is rectangular. There are radio chips on each of the four sides of the CPU. The sides shown as top, left, and bottom in the drawing figure each have a respective radio 424, 410, 420 coupled to a respective Tx, Rx antenna pair 426, 412, 422. The side shown as the right side shows five radios each connected to a respective antenna pair. The number of radios and antennas on each side may be determined based on communication rate needs in each direction.

Very few high speed links may be required on a microserver package. A single link is able to deliver data rates in excess of 40 Gb/s across a distance of a few cm. The data rate may still be on the order of 5-10 Gb/s for transmission distances of up to 50 cm.

FIG. 4 shows many wireless links implemented on the same side of one package. This allows the aggregate data rate to be increased. Alternatively, the data may be sent to different other devices that are in the same general direction. Both the radio chips and the antennas are placed towards the edge of the package to limit obstructions in the radio path that may come from heat sinks and heat spreaders. In general the losses for a copper trace baseband signal are much lower than the losses through the same copper trace for an RF signal. As a result, the radio chips may be kept very close to the antenna. This limits electrical signal and power losses due to the RF routing through the substrate. The radio chip may be installed onto the package in any manner desired and may even be embedded in or a part of the substrate. By using multiple radios, the on-package millimeter-wave wireless interconnects can be scaled for extremely high data rate applications. This may be useful in systems such as servers and media recording, processing, and editing systems. As shown, multiple links can be put together to achieve data-rates close to a Tb/s.

Figure 5:
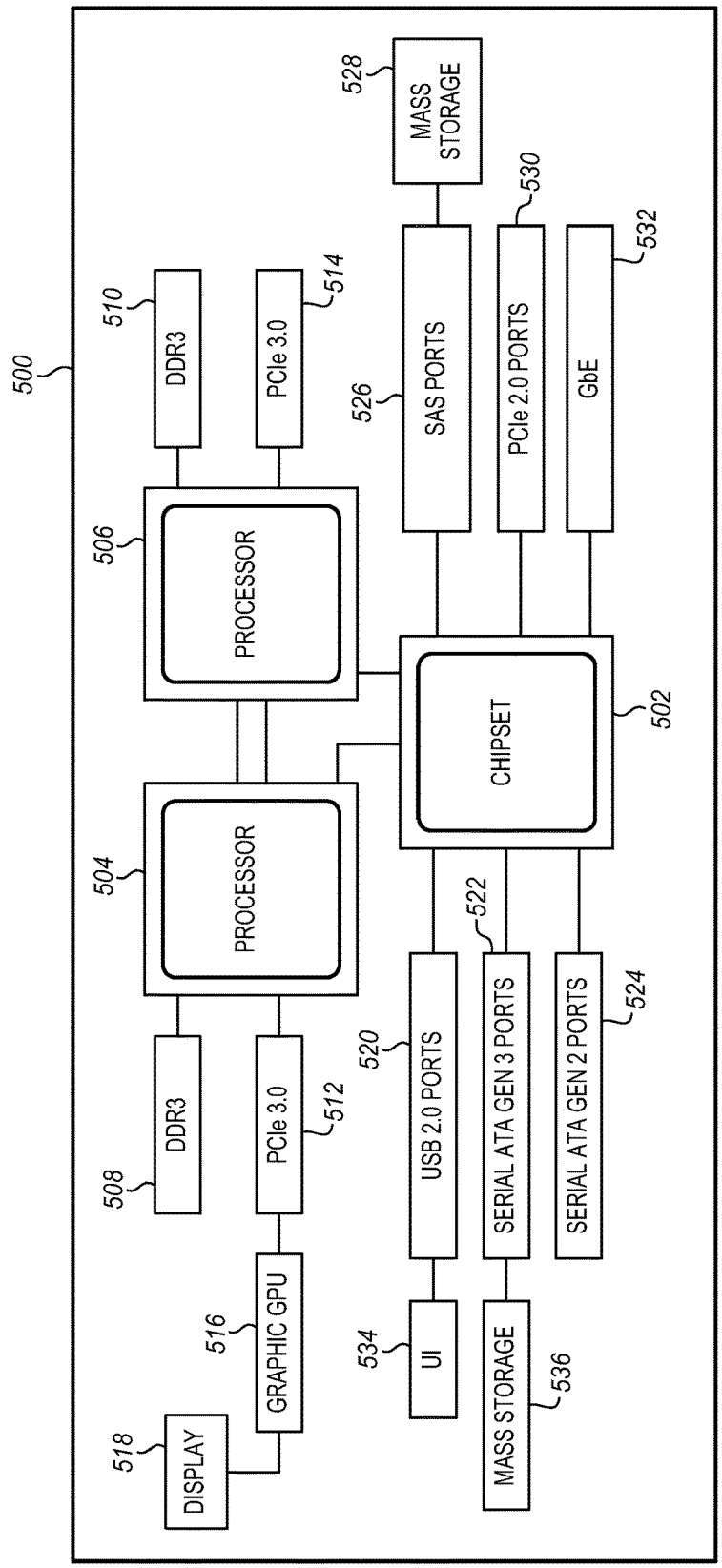
FIG. 5 is block diagram of a computing system with multiple high speed interfaces according to an embodiment.

FIG. 5 is a block diagram of a computing system 500 with multiple high speed interfaces that may be implemented using the wireless connections as described herein. The computing system may be implemented as a server, microserver, workstation, or other computing device. The system has two processors 504, 506 having multiple processing cores although more processors may be used, depending on the particular implementation. The processors are coupled together through a suitable interconnect such as the wireless interconnect described herein. The processors are each coupled to a respective DRAM (Dynamic Random Access Memory) module 508, 510 using a suitable connection, such as the wireless connection described herein. The processors are also each coupled to a PCI (Peripheral Component Interconnect) interface 512, 514. This connection may also be wired or wireless.

The PCI interfaces allow for connections to a variety of high speed additional components such as graphics processors 516 and other high speed I/O systems for display, storage and I/O. The graphics processor drives a display 518. Alternatively, the graphics processor is core or a die within one or both of the processors. The graphics processor may also be coupled to a different interface through a chipset.

The processors are also both coupled to a chipset 502 which provides a single point of contact for many other interfaces and connections. The connection to the chipset may also be wired or wireless, one or both of the processors may be connected to the chipset, depending on the implementation. As shown, a processor 504 may have a wireless connection to one or more processors 506, memory 508, peripheral components 512, and a chipset 502. These connections may all be wireless as suggested by the multiple radio and antennas of FIG. 4. Alternatively, some of these connections may be wired. The processor may have multiple wireless links to the other processor. Similarly the chipset 502 may have wireless connections to one or more of the processors as well as to the various peripheral interfaces as shown.

The chipset is coupled to USB (Universal Serial Bus) interface 520 which may provide ports for connections to a variety of other devices including a user interface 534. The chipset may be connected to SATA (Serial Advanced Technology Attachment) interfaces 522, 524 which may provide ports for mass storage 536 or other devices. The chipset may be connected to other high speed interfaces such as a SAS (Serial Attached Small computer serial interface) interface 526 with ports for additional mass storage 528, additional PCI interfaces 530 and communications interfaces 532, such as Ethernet, or any other desired wired or wireless interface. The described components are all mounted to one or more boards and cards to provide the described connections.

Figure 6:
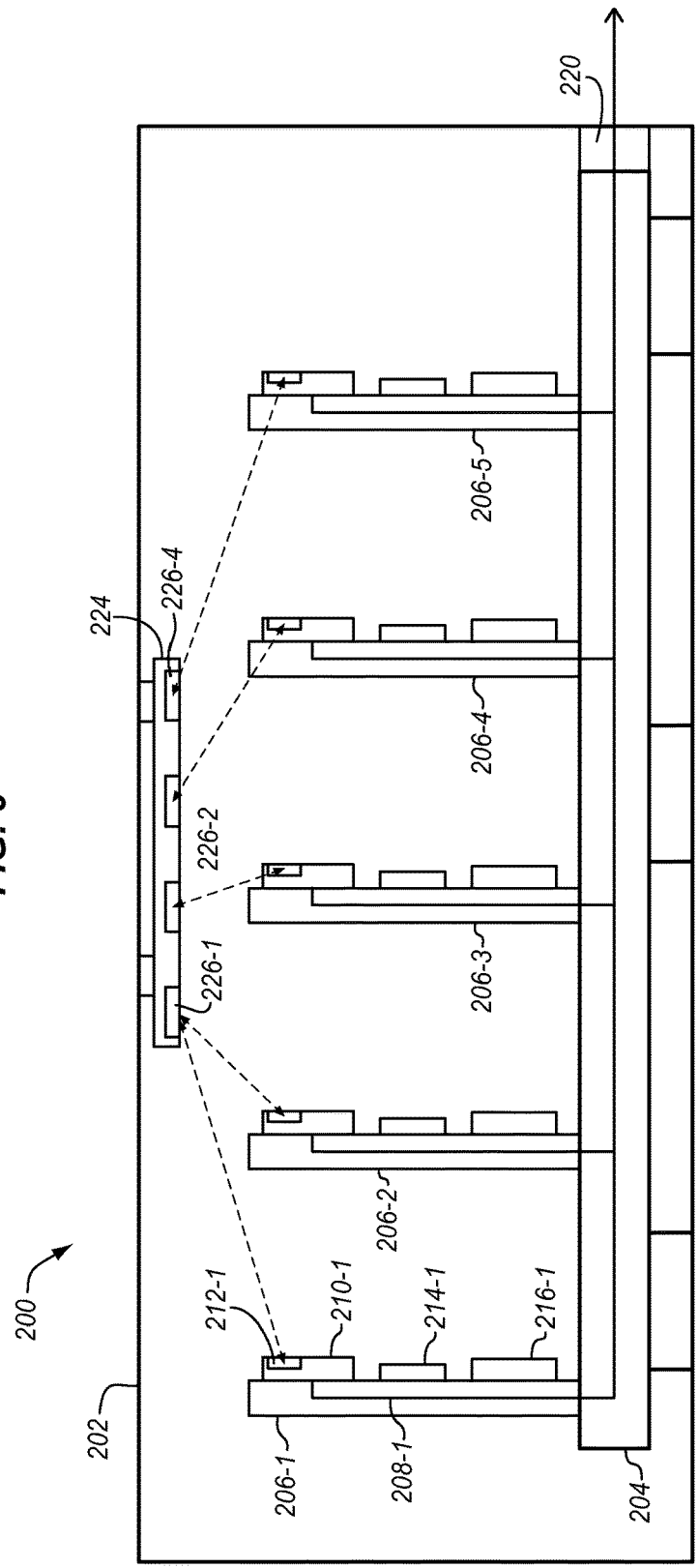
FIG. 6 is a side view diagram of a blade server with communication through a switch according to an embodiment.

FIG. 6 is a side view diagram of a blade server system, such as a microserver. The same approach as shown here may be adapted to storage arrays, communication blades, Rack-Scale-Architecture (RSA), and other similar types of systems. The system 200 has a blade enclosure 202 with an internal backplane 204. The backplane connects to each blade. There are five blades 206-1, 206-2, 206-3, 206-4, 206-5, installed in the enclosure and connected to the backplane. This is provided as an illustration, there may be more or fewer blades, depending on the implementation.

In this example, each blade includes a CPU package 210 with a wireless interface 212 as shown in FIG. 2, a high speed memory 214, and a mass memory 216. Alternatively, the radio may be located in a different position or on a different package or in its own package. Each blade is built on a motherboard with an electrical connection 208 to the backplane. While this connection is shown as a simple line, there may be many different types of connections, each with multiple links, channels, or lanes, such as SMBus, PCI-E, Ethernet, and power. The backplane is connected to each blade and allows the blades to communicate with each other for task distribution and data management. The backplane also include an external I/O (Input/Output) interface 220 to connect the blades and the enclosure to external equipment.

The enclosure also includes a wireless router or switch 224 in the enclosure with multiple antennas 226-1, 226-2, 226-3, 226-4. Each antenna communicates with one or more blades through the respective blade wireless interface 212. The switch routes data and control signals to and from each of the blades. While the switch 224 is shown as positioned in a single location, the antennas and optionally components of the switch may be distributed throughout the enclosure to locations that are easily accessible by a respective blade. The wireless interfaces and the switch provide a data channel that is independent of the backplane and which does not require any direct wiring to a blade. If a blade is shut down, removed, or replaced, there is no mechanical connection required to enable the wireless connection.

In some embodiments radio wave reflectors may be used in the enclosure to guide the signal on a path around any obstructions within the enclosure. The radio connection paths may be reconfigured with a change in the active blades. This allows some communication links to be de-activated and used to establish redundant links to other nodes. Links may also be aggregated to increase data rates and shut down to reduce power consumption. The switch node 224 may add additional capabilities to the system. It may have multiple antennas to enable many simultaneous channels with a single CPU. The switch node may perform the switching through a wired connection, through a special control channel, or in the passband at millimeter wave. Using the passband reduces the power consumption required by the modulators, demodulators and RF (radio frequency) amplifiers. Such a system may be implemented in a manner similar to a full optical network switching system.

The switch 224 serves to introduce one or more pico-cells inside the enclosed chassis of the microserver to monitor and manage its performance. The pico-cell operates at mm-wave frequencies. It has a main hub (a.k.a. mini tower) that can handle relatively high data rates. Each microserver unit may also have a low speed wireless link and communicate directly with the main hub.

The switch 224 may also be coupled to the backplane to control the powering on or off of the wireless links and to control the communication links. Alternatively all of the control, status, and system management may be controlled through the wireless links. When a blade has a data stream to send to another blade, the switch is able to receive a request from the blade. The request may be a push or a ping on the shared backplane or it may be the setting of a line to a high or low value. The switch then sends a command to the other blade to activate its radio transceiver that corresponds to the requesting blade. In this way, the switch activates the wireless data link. The antennas of the switch may be configured to transmit and receive between two or three blades simultaneously so that each channel may be used for any one of the blades within its transmit range. This provides multiple possible links between any two blades. Steerable beams, using for example a phased array antenna, or switchable beams, using for example multiple discrete antennas, may also be used by the switch to more precisely direct power to a particular blade. The switch may determine how many of the links to establish for each communication session. The multiple paths allow the connection paths to be reconfigured. This allows some communication links to be de-activated and used to establish redundant links to other nodes. The links may then be aggregated to increase data rates and shut down to reduce power consumption.

The switch may also deactivate any one or more of the links independently of each other link. The blades may request that a link be torn down or the switch may detect that the link has been inactive for some period of time and therefore request that the radio transceivers be powered down. By turning off the transceivers when possible, the system may reduce power consumption, heat dissipation and radio interference within the blade enclosure.

In another example, the switch is coupled to an ACPI (Advance Configuration and Power Interface) component chip on the chassis. This component determines and controls power consumption for each of the blades as well as clock rates. When a blade enters a low power mode then the switch can determine this from the ACPI component and command that radio transceivers be deactivated. Similarly, when a blade is switched to an active or high speed state the radio transceivers of that blade and those that connect to that blade may be activated.

The switch not only manages the wireless links with each blade but also acts as a relay or repeater. The switch routes the data stream received from each source blade to the intended other destination blade using the corresponding link and an appropriate assigned path. The switch may employ passive switching using a passive waveguide network, active reflectors or other techniques. Alternatively, the switch may be an active repeater capable of buffering the data streams, remodulating, amplifying, and any other desired functions.

The switch may also receive status and activity information from the ACPI or directly from each blade. In this way the switch is able to determine which ones of the blade transceivers are transmitting. This information may also be used to determine whether radio links are to be activated or deactivated.

The configuration of the single central switch 224 provides additional flexibility if there are multiple wireless links from the switch to each blade. This allows the switch to then dedicate each link to a different blade or to aggregate the links so that higher data rates are provided between one pair of blades than between another pair of blades. The switch may be made to determine suitable data rates and channel allocations for each blade.

Figure 7:
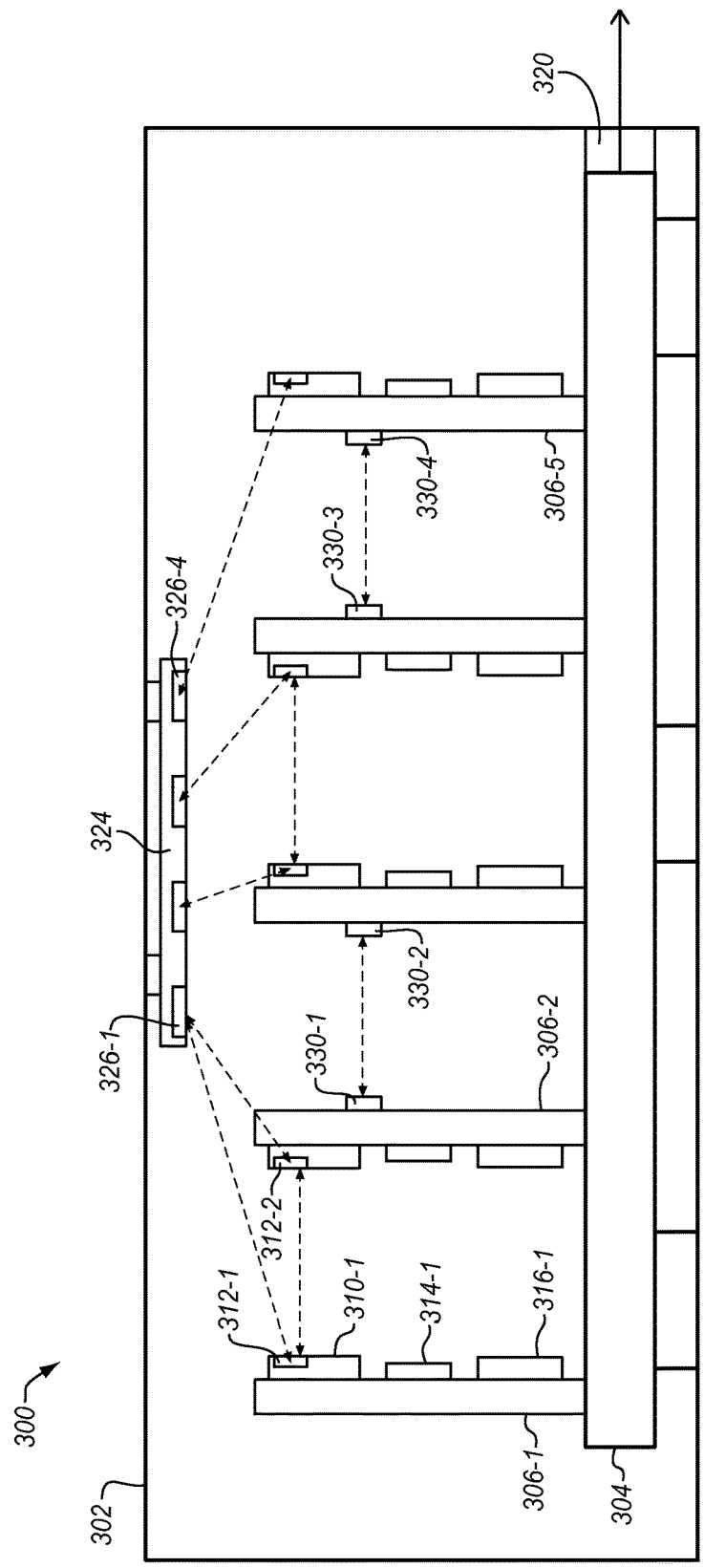
FIG. 7 is a side view diagram of a blade server with communication through a switch and directly between adjacent processors according to an embodiment.

FIG. 7 is a diagram of an alternative blade server system 300 in which the blades communicate wirelessly directly with nearby blades providing more communication channels. The system has an external enclosure 302 with a backplane 304 connected to multiple blades 306-1, 306-2, 306-3, 306-4, 306-5. The blades are similar to those described above and include a CPU 310, a volatile memory 314, and a mass memory 316. The configuration of the blades may be modified to suit different uses and the blades may be different from each other for specialized applications as described above.

In order to provide direct communication there are two different possible independent additional wireless channels. In addition to the wireless interface 312 attached to each CPU package 310, some or all of the blades may include an additional radio 330-1, 330-2, 330-3, 330-4 on the backside of the blades. As shown, the blades are based on a motherboard with a top or front side and a bottom or back side. The components, processors, memory, data interfaces, power regulators etc. are all mounted on the front side. This means that the radio is also mounted on the front side. The motherboard limits the radio to a maximum possible hemisphere or 180° of transmit and receive directions. A radio on the back side allows for the other hemisphere or 180° of possible transmit and receive directions. The second radio also provides for at least one more full data channel, doubling the data rate over that of the single front side radio.

A second additional wireless channel is provided by allowing the blades to communicate not only with the switch but also with the adjacent or nearby blades. While in the previous embodiment all of the blades are facing the same direction, in this embodiment, the blades are installed back-to-back and face-to-face. This requires only small modification to the backplane, reversing the direction of every other socket and a small modification to every other receiving slot to accommodate the blade in reverse position. As a result the odd-numbered blades 1, 3, 5, . . . are facing to the right and the even numbered blades 2, 4, 6, . . . are facing to the left. In other words, the blades are paired so that each blade is facing one other blade front side to front side.

The face-to-face configuration means that the CPU packages and associated radios of each blade pair are facing each other. These radios are in each other's line of sight and can communicate directly without the switch 324. This communication may be done using an additional radio. In this case, the radio 312-1 represents two radios. The first radio has a wide upward antenna beam to communicate with the switch antenna 326-1 above. The second radio has a narrow lateral beam to communicate directly with adjacent blade. Since the blades are close together in the enclosure and the radios are in the same or very close to the same position, the direct wireless link is very short and within a direct line of sight of the radios on each die. In the event that the enclosure has cooling, bracing, wiring or other structures between the blades, the enclosure may be adapted by providing an opening for the radio communications between blades. Alternatively, there may be a single beam that is steered to either the switch or another blade using a phased array antenna. As another alternative, a single radio die may be coupled to two different antennas, one directed to the switch and the other directed to the adjacent blade.

Another way for the two blades to communicate with each other is for the antennas of each CPU package radio 312-1, 312-2 to have a wider transmit and receive beam. An appropriate antenna is provided so that a single signal is received both at the switch antenna 326-1 and the adjacent blade radio 312-2. In this case, the dotted line represents two different logical channels but the same physical radio signal. The data packets between the three nodes may be identified with packet headers, modulation formats, or other characteristics so that the receiver can determine whether a packet is directed to the switch or the adjacent blade. This approach has an advantage of less cost and hardware complexity, but the amount of data is limited by the single data channel of the one radio. For a more flexible approach, the CPU package may have multiple radios or radio channels to increase the total possible amount of data that may be transmitted. The radios may each have wide transmit and receive antennas so that all of the radio may communicate either with the switch or with the adjacent blade. In this way the blade may send one or more of the signals to the switch and one or more of the signals also to the adjacent blade simultaneously.

There is also a communications channel between the adjacent pairs of blades, that is between the back-to-back blades. As shown, each blade optionally has a back-side radio 330. Two back-to-back blades have adjacent back side radios 330-1, 330-2 facing each other. This allows for a direct communications path with a line of sight channel between the two blades that does not include the switch. The radios may have one or more channels for these back side radios.

Figure 8:
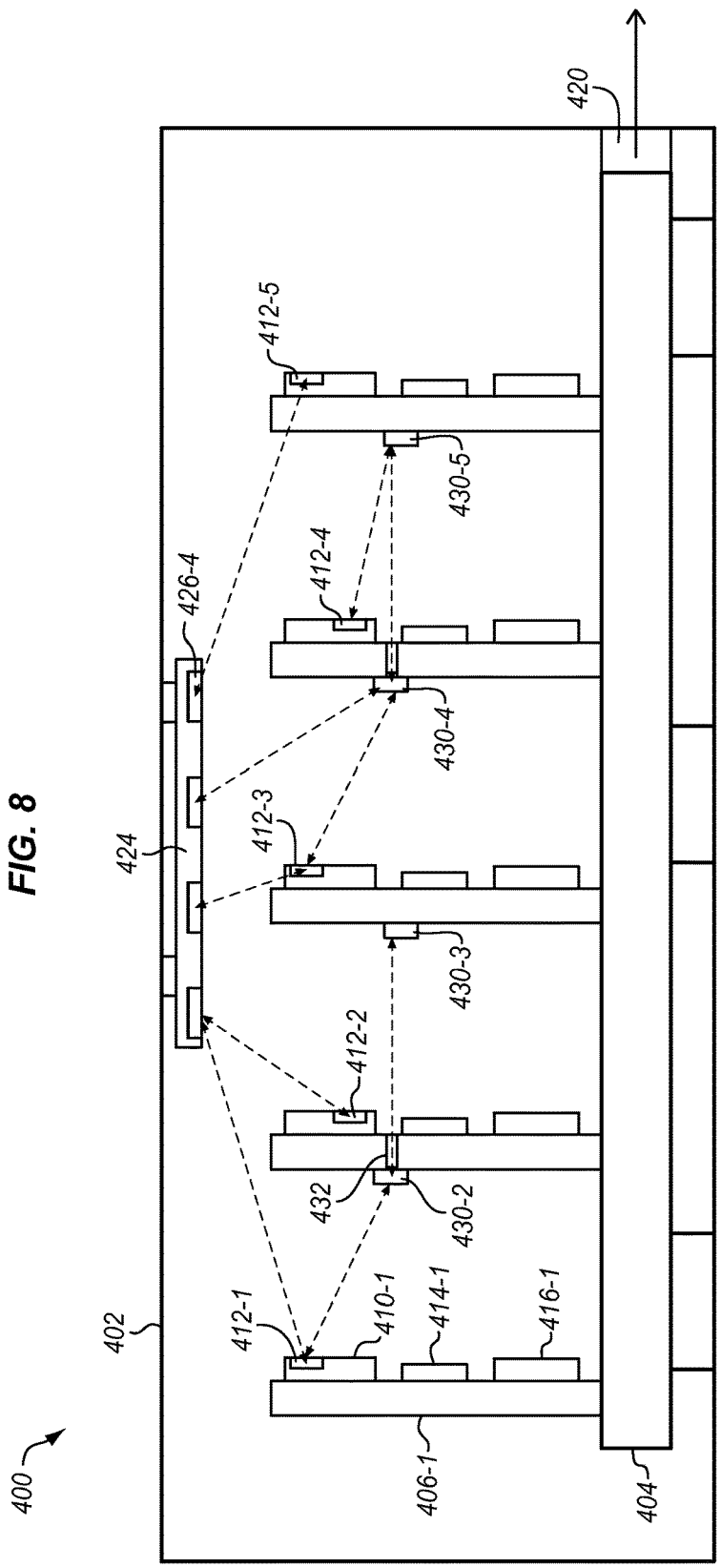
FIG. 8 is a side view diagram of a blade server with communication through a switch, directly between adjacent processors, and through adjacent back side radios according to an embodiment.

FIG. 8 is a diagram of an alternative blade server system 400 in which all of the blades face the same direction as in FIG. 6 within the enclosure. However, at least some of the blades also have a back side radio for communication with the adjacent blade. This blade server system may be a microserver or a larger server system, a storage array, communication router, Rack-Scale-Architecture (RSA), and other similar types of systems. The system 400 has a blade enclosure 402 with an internal backplane 404. The backplane connects to each blade. There are five blades 406-1, 406-2, 406-3, 406-4, 406-5, installed in the enclosure and connected to the backplane. More or fewer blades may be used depending on the implementation.

In this example, each blade includes a CPU package 410 with a wireless interface 412, a high speed memory 414, and a mass memory 416. The placement of the radio is provided as an example and different positions may be used on a different package or in its own package. The blades connect to a backplane for power and optionally for data, control, system management, and other purposes. The backplane also provides external I/O (Input/Output) access through an external interface 420.

A wireless router or switch 424 in the enclosure with multiple antennas 426-1, 426-2, 426-3, 426-4 communicates with the blades through the respective blade wireless interfaces 412. The switch routes data and control signals to and from each of the blades. While the switch 224 is shown as positioned in a single location, the antennas and optionally components of the switch may be distributed throughout the enclosure to locations that are easily accessible by a respective blade. In addition to the switch connection, the blades are also able to communicate directly using back side radios 430.

For a simple direct communication, a CPU or front side radio 412 is able to communicate with the back side radio 430 of the adjacent blade. This is shown, for example, as the first, third and fourth blade front side radios 412-1, 412-3, 413-4 communicating directly with the second, fourth, and fifth blade back side radios 430-2, 430-4, 430-5, respectively. These front side radios may also communicate with the switch using any one or more of the techniques and structures described above with respect to FIG. 7.

The systems of FIGS. 7 and 8 may also provide additional communication paths as shown in FIG. 8. A first additional path is through an aperture 432 in the blade motherboard. This aperture allows two back side radios 430-2, 430-3 to communicate directly when the blades are all aligned front-to-back. As shown the second blade's back side radio 430-2 may also be able to communicate with the first blade's front side radio 412-1. This may be done, for example by providing for two antennas on the back side radio 430-2 one directed to each of the other radios. Another additional communication path is through a blade's motherboard. The signals received by the back side radio 430-2 may be electrically communicated to the front side radio 412-2 of the same blade. This communication may be through wiring within the motherboard or through a dedicated electrical connection.

Figure 9:
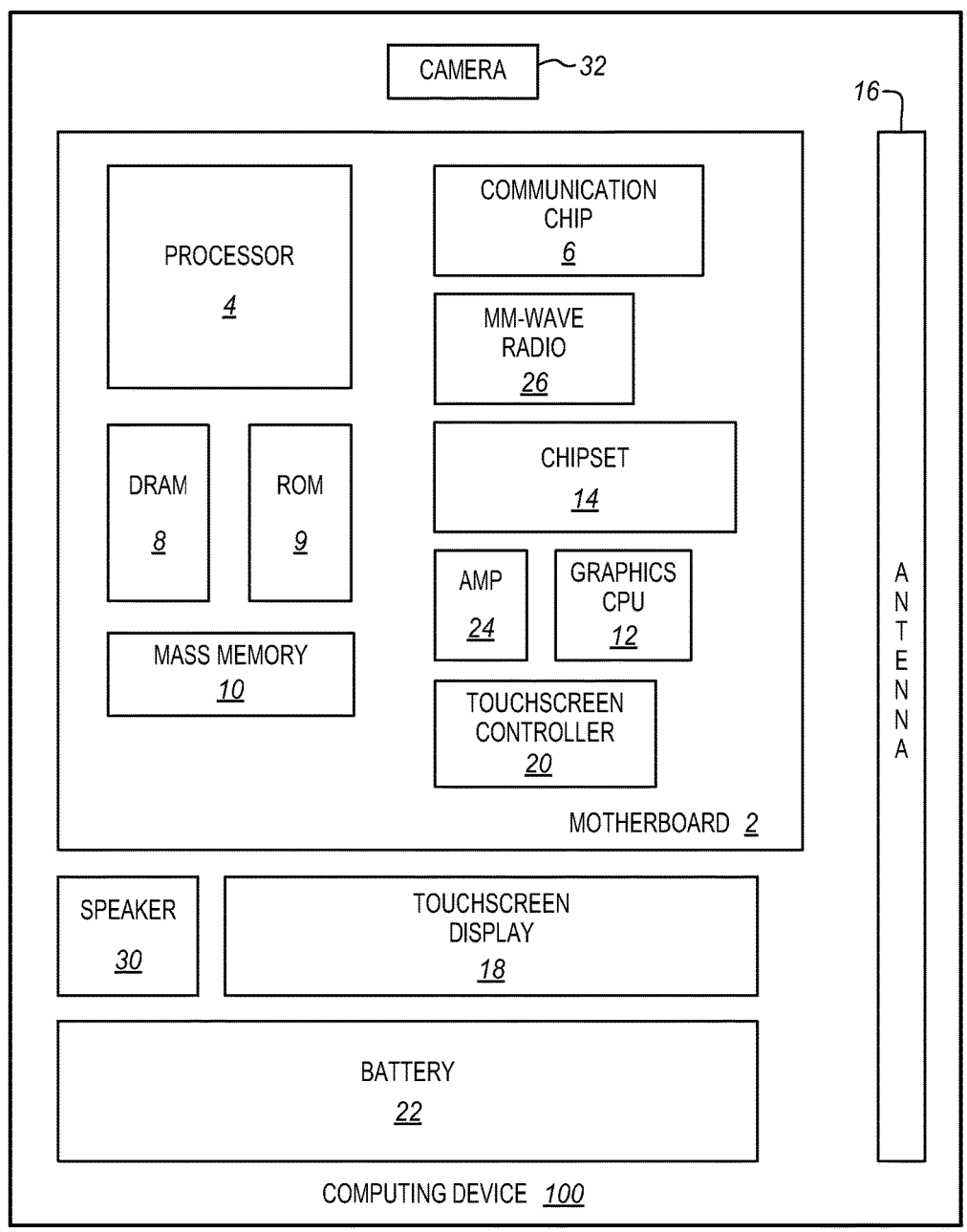
FIG. 9 is a block diagram of a computing device incorporating wireless interfaces according to an embodiment.

FIG. 9 illustrates a computing device 100 in accordance with another implementation. Such a computing device represents another implementation of a blade as described above. The figure may also serve as a functional representation of a fully functional blade server. The computing device 100 houses a board 2. The board 2 may include a number of components, including but not limited to a processor 4, at least one communication chip 6, and a millimeter wave radio 26. The processor 4 is physically and electrically coupled to the board 2. In some implementations the at least one communication chip 6 and radio 26 are also physically and electrically coupled to the board 2. In further implementations, the radio 26 is part of a processor package.

Depending on its applications, computing device 11 may include other components that may or may not be physically and electrically coupled to the board 2. These other components include, but are not limited to, volatile memory (e.g., DRAM) 8, non-volatile memory (e.g., ROM) 9, flash memory (not shown), a graphics processor 12, a digital signal processor (not shown), a crypto processor (not shown), a chipset 14, an antenna 16, a display 18 such as a touchscreen display, a touchscreen controller 20, a battery 22, an audio codec (not shown), a video codec (not shown), a power amplifier 24, a speaker 30, a camera 32, and a mass storage device (such as hard disk drive) 10, compact disk (CD) (not shown), digital versatile disk (DVD) (not shown), and so forth). These components may be connected to the system board 2, mounted to the system board, or combined with any of the other components.

The communication chip 6 enables wireless and/or wired communications for the transfer of data to and from the computing device 11 through an antenna 16. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 6 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 11 may include a plurality of communication chips 6. For instance, a first communication chip 6 may be dedicated to shorter range wireless communications such as Wi-Fi and Bluetooth and a second communication chip 6 may be dedicated to longer range wireless communications such as GPS, EDGE, GPRS, CDMA, WiMAX, LTE, Ev-DO, and others.

In some implementations, any one or more of the components may be configured on a blade and adapted to use the millimeter wave wireless connections described herein through the millimeter wave radio 26. The features of the system of FIG. 9 may be embodied in one or more blades or in a combination of blades and blade enclosure. For example, a blade may carry multiple processors. Any blade or blade system may include any one or more of the peripherals shown in FIG. 9. The term "processor" may refer to any device or portion of a device that processes electronic data from registers and/or memory to transform that electronic data into other electronic data that may be stored in registers and/or memory.

In various implementations, the computing device 11 may be a desktop computer, a server, a set-top box, an entertainment control unit, or a digital video recorder. In further implementations, the computing device 11 may be any other electronic device that processes data.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to an apparatus that includes a blade enclosure, a first blade in the enclosure having a radio transceiver to communicate with a radio transceiver of a second blade in the enclosure, the second blade having a radio transceiver to communicate with the radio transceiver of the first blade, and a switch in the enclosure to communicate with the first blade and the second blade and to establish a connection through the respective radio transceivers between the first blade and the second blade.

In further embodiments the switch establishes the connection by activating the respective radio transceivers.

In further embodiments the first blade comprises a processor package including a processor and the radio transceiver.

In further embodiments the first blade comprises a motherboard having a front side and a back side and a processor, wherein the radio transceiver and the processor are attached to the front side, the first blade further comprising a second radio transceiver attached to the back side of the motherboard to communicate with another blade without communicating with the switch.

In further embodiments the second blade comprises a motherboard having a front side and a back side, wherein the radio transceiver and the processor are attached to the front side, the second blade further comprising a second radio transceiver attached to the back side of the motherboard, wherein the back side of the first blade faces the back side of the second blade in the enclosure, wherein the back side transceiver of the first blade communicates with the back side transceiver of the second blade.

In further embodiments wherein the switch has a radio transceiver to communicate through the respective radio transceivers of the first and the second package.

In further embodiments the switch has a first radio transceiver to communicate with the first package and a second radio transceiver to communicate with the second package and wherein the connection between the first package and the second package is through the switch.

In further embodiments the connection between the first package and the second package is through a third package, the third package having a first transceiver to communicate directly with the first package and a second transceiver to communicate directly with the second package and wherein the switch establishes the connection by assigning a path through the third package.

In further embodiments the radio transceiver of the first package comprises a steerable beam to communicate with either the second package or the third package by steering the beam and wherein the switch establishes the connection by assigning a steering of the beam.

In further embodiments the steerable beam comprises a phased array antenna.

Further embodiments include a backplane in the enclosure coupled to the first and the second blade and wherein the first and the second blade communicate through the backplane.

Further embodiments include an aperture defined by and through the motherboard proximate the second transceiver and wherein the second transceiver transmits through the aperture to a third blade without communicating through the switch.

Some embodiments pertain to a method that includes receiving a request to connect from a first blade having a radio transceiver at a switch, sending a request to connect from the switch to a second blade having a radio transceiver, the first blade, the second blade, and the switch being housed in a blade server enclosure, and establishing a connection by the switch through the respective radio transceivers between the first blade and the second blade.

In further embodiments establishing the connection comprises activating the respective radio transceivers by the switch.

In further embodiments the switch has a first radio transceiver to communicate with the first blade and a second radio transceiver to communicate with the second blade and wherein the connection between the first blade and the second blade is through the switch.

In further embodiments wherein establishing a connection comprises establishing a connection by assigning a path through a third blade, the third blade being carried by the system board and having a first transceiver to communicate directly with the first blade and a second transceiver to communicate directly with the second blade.

In further embodiments wherein receiving and sending comprise receiving through a backplane from the first blade and sending through the backplane to the second blade.

Some embodiments pertain to a blade of a blade server that includes a motherboard, a processor attached to the motherboard, a memory attached to the motherboard and coupled to the processor, a backplane interface attached to the blade to connect to a backplane of a blade enclosure, and a millimeter wave radio transceiver coupled to the processor to communicate with a millimeter wave radio transceiver of a second blade in the blade enclosure.

In further embodiments the radio transceiver and the processor are attached to a front side of the motherboard, the blade further comprising a second radio transceiver attached to a back side of the motherboard to communicate with another blade without communicating with a switch.

In further embodiments the first blade comprises a processor package including the processor and the radio transceiver.

The invention claimed is:

1. An apparatus comprising:
   a blade enclosure:
      a first blade in the enclosure having a radio transceiver to communicate with a radio transceiver of a second blade in the enclosure, wherein the radio transceiver of the first blade comprises a phased antenna array that establishes a direct connection to communicate with the transceiver of the second blade based on an assignment established by a switch in the enclosure and separate from the first blade and the second blade;
      the second blade having a radio transceiver to communicate with the radio transceiver of the first blade; and
      the switch in the enclosure to communicate with the first blade and the second blade and to establish the direct connection through the respective radio transceivers between the first blade and the second blade, wherein the switch establishes the direct connection by the assignment of a steerable beam direct radio path between the first blade and the second blade.

2. The apparatus of claim 1, wherein the switch establishes the connection by activating the respective radio transceivers.

3. The apparatus of claim 1, wherein the first blade comprises a processor package including a processor and the radio transceiver.

4. The apparatus of claim 1, wherein the first blade comprises a motherboard having a front side and a back side and a processor, wherein the radio transceiver and the processor are attached to the front side, the first blade further comprising a second radio transceiver attached to the back side of the motherboard to communicate with another blade without communicating with the switch.

5. The apparatus of claim 4, wherein the second blade comprises a motherboard having a front side and a back side, wherein the radio transceiver and the processor are attached to the front side, the second blade further comprising a second radio transceiver attached to the back side of the motherboard, wherein the back side of the first blade faces the back side of the second blade in the enclosure, wherein the back side transceiver of the first blade communicates with the back side transceiver of the second blade.

6. The apparatus of claim 1, wherein the switch has a radio transceiver to communicate through the respective radio transceivers of the first blade and the second blade.

7. The apparatus of claim 1, wherein the switch has a first radio transceiver to communicate with the first blade and a second radio transceiver to communicate with the second blade.

8. The apparatus of claim 1, further comprising a backplane in the enclosure coupled to the first and the second blade and wherein the first and the second blade communicate through the backplane.

9. The apparatus of claim 4, wherein the first blade further comprises an aperture defined by and through the motherboard proximate the second transceiver and wherein the second transceiver transmits through the aperture to a third blade without communicating through the switch.

10. A method comprising:
    receiving a request to connect from a first blade having a radio transceiver at a switch;
    sending a request to connect from the switch to a second blade having a radio transceiver, the first blade, the second blade, and the switch being housed in a blade server enclosure, wherein the switch is separate from the first bade and the second blade; and
    establishing a direct connection by the switch through the respective radio transceivers between the first blade and the second blade, wherein the respective radio transceivers each comprises a phased antenna array and, wherein the switch establishes the direct connection by assigning a steerable beam direct radio path between the first blade and the second blade.

11. The method of claim 10, wherein establishing the direction connection comprises activating the respective radio transceivers by the switch.

12. The method of claim 10, wherein the switch has a first radio transceiver to communicate with the first blade and a second radio transceiver to communicate with the second blade.

13. The method of claim 10, wherein receiving and sending comprise receiving through a backplane from the first blade and sending through the backplane to the second blade.

* * * * *